(12) United States Patent
Chai et al.

(10) Patent No.: US 11,193,639 B2
(45) Date of Patent: Dec. 7, 2021

(54) LIGHT MODULE AND METHOD OF MANUFACTURING THE SAME

(71) Applicant: Delta Electronics (Shanghai) Co., Ltd., Shanghai (CN)

(72) Inventors: Zhaowei Chai, Shanghai (CN); Chun-Jen Chung, Shanghai (CN); Xiaoping Fu, Shanghai (CN); Xinghua Zhang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 17/157,941

(22) Filed: Jan. 25, 2021

(65) Prior Publication Data
US 2021/0148530 A1    May 20, 2021

Related U.S. Application Data

(62) Division of application No. 16/827,684, filed on Mar. 23, 2020, now Pat. No. 10,935,197.

(30) Foreign Application Priority Data

Apr. 4, 2019    (CN) .......................... 201910271084.5
May 23, 2019    (CN) .......................... 201910435867.2

(51) Int. Cl.
*H05K 1/14*     (2006.01)
*F21S 8/04*     (2006.01)
(Continued)

(52) U.S. Cl.
CPC .............. *F21S 8/04* (2013.01); *F21V 23/005* (2013.01); *H05K 1/144* (2013.01); *H05K 1/181* (2013.01);
(Continued)

(58) Field of Classification Search
CPC .... F21V 23/004; F21V 23/005; F21V 23/006; H05K 1/14
(Continued)

(56) References Cited

U.S. PATENT DOCUMENTS 8,482,928 B2 ‡    7/2013  Capeleto ................ H05K 1/148
                                                              361/749
2020/0296832 A1 ‡  9/2020  Taziri ..................... H05K 1/142

FOREIGN PATENT DOCUMENTS

CN    204153494 U  ‡  2/2015
CN    106358331 A  ‡  1/2017
(Continued)

*Primary Examiner* — Christopher M Raabe
(74) *Attorney, Agent, or Firm* — CKC & Partners Co., LLC (57) ABSTRACT

A light module and a manufacturing method are provided. The light module comprises a first and a second substrate separated from a prefabricated substrate along a closed curve, the first substrate is detachable connected and/or fixed with the second substrate; light emitting elements mounted on one of the first and second substrate; and a drive element mounted on the other one of the first and second substrate. The method comprises: determining a closed curve on a prefabricated substrate to separate the prefabricated substrate into a first region and a second region; providing light emitting elements and first electronic element on first surface of the prefabricated substrate; providing second electronic element on second surface of the prefabricated substrate; separating a first and second substrate from the prefabricated substrate along the closed curve; and assembling and connecting the second substrate with the first substrate at a separation opening.

11 Claims, 9 Drawing Sheets

(51) Int. Cl.
*H05K 3/36* (2006.01)
*H05K 1/18* (2006.01)
*F21V 23/00* (2015.01)
*F21Y 105/18* (2016.01)
*F21Y 115/00* (2016.01)
*H05K 3/30* (2006.01)

(52) U.S. Cl.
CPC .......... *H05K 3/368* (2013.01); *F21Y 2105/18* (2016.08); *F21Y 2115/00* (2016.08); *H05K 3/303* (2013.01); *H05K 2201/09027* (2013.01); *H05K 2201/09063* (2013.01); *H05K 2201/10106* (2013.01)

(58) Field of Classification Search
USPC .......................................................... 445/23
See application file for complete search history.

(56) References Cited

FOREIGN PATENT DOCUMENTS

| | | | | | |
|---|---|---|---|---|---|
| CN | 206875175 U | ‡ | 1/2018 | ............. | F21V 19/00 |
| CN | 207455306 U | ‡ | 6/2018 | | |
| CN | 207962356 U | ‡ | 10/2018 | | |
| JP | 2016021406 A | ‡ | 2/2016 | | |
| JP | 2016170988 A | ‡ | 9/2016 | | |
| KR | 101250799 B1 | * | 4/2013 | | |

\* cited by examiner
‡ imported from a related application

LIGHT MODULE AND METHOD OF MANUFACTURING THE SAME

CROSS-REFERENCE TO RELATED APPLICATIONS

This is a divisional application of the U.S. application Ser. No. 16/827,684 filed on Mar. 23, 2020, which claims priority on Patent Application No. 201910271084.5 filed in P.R. China on Apr. 4, 2019 and No. 201910435867.2 filed in P.R. China on May 23, 2019, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

TECHNICAL FIELD

The present invention relates to the field of illumination, in particular, a light module and a method of fabricating the same.

BACKGROUND

With the fast development of science and technology, illumination products have affected on all aspects of people's lives. However, due to dramatically rising of labor cost, and demanding on strengthening of environmental protection, cost of illumination materials is continuously increasing. In addition, price wars in the illumination product industry are quite common, thus profits of the illumination products decline sharply. Moreover, as competition increasing, one may reduce the manufacture cost to keep its competitiveness. Therefore, integrating a lamp panel with a power supply board has been widely applied as a design trend.

Figure 1:
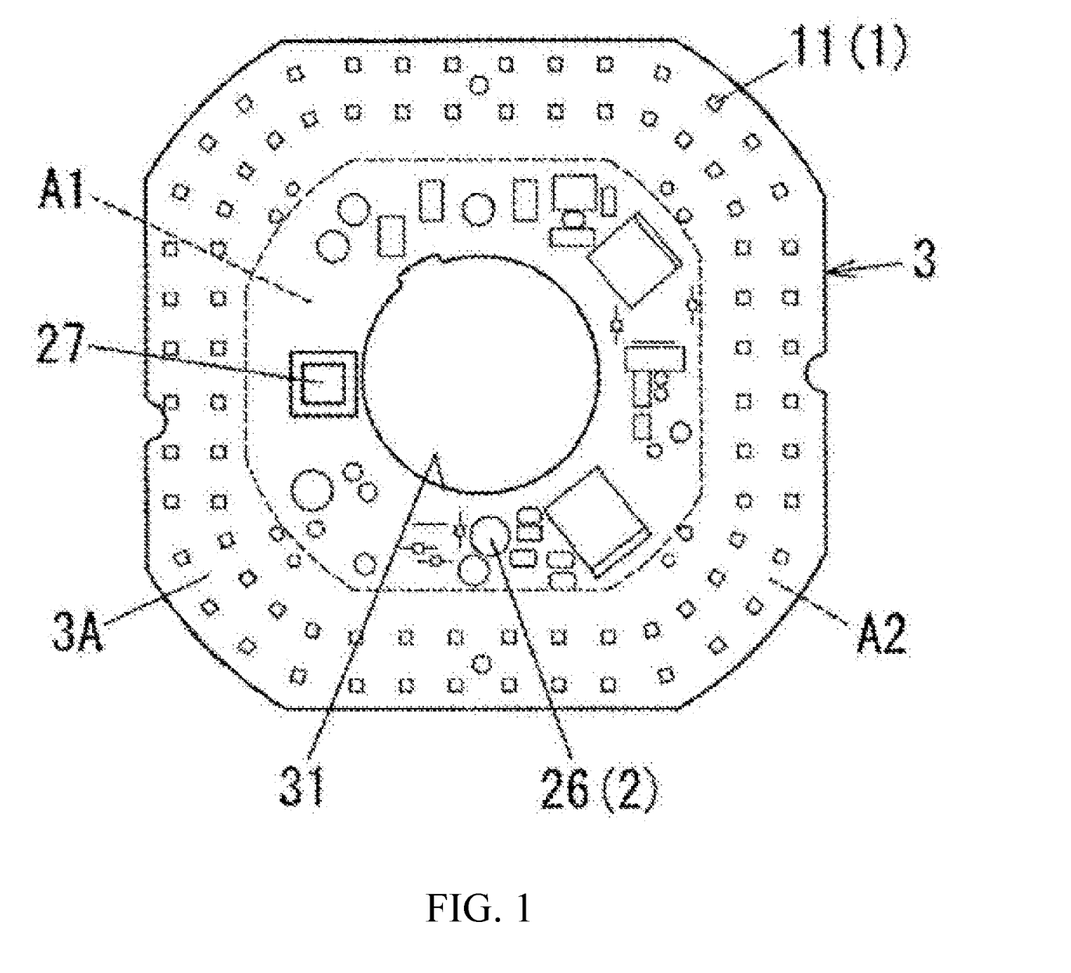
FIG. 1 illustrates a schematic view of a light module in the related art.

As shown in FIG. 1, a circuit board 3 has an inner region A1 and an outer region A2. The outer region A2, acting as a lamp panel, is disposed with light emitting elements 11, and the inner region A1, acting as a power supply board, is disposed with power supply components 26, 27 for driving the light emitting elements 11 to emit light. The power supply components 26, 27 often include SMT (Surface Mounted Technology) type elements similar with the light emitting elements 11, as well as DIP (dual in-line package) type elements which may occupy large space of the power supply board. When the illumination product is installed on a surface (e.g. a ceiling), an illuminating surface (i.e., a front surface) of the circuit board 3 provided with the light emitting elements would face downwardly to provide illumination, while another surface (i.e., a back surface) opposite to the illuminating surface of the circuit board 3 is tightly close to the ceiling, such that the circuit board 3 is fixed onto the ceiling. Since a clearance between the back surface of the circuit board 3 and the ceiling is narrow, only SMT type components can be accommodated in the space. Given such narrow clearance limitation, some sort of common design in the industry would preferably place SMT type power supply components on the back surface of the circuit board 3, and place light emitting elements and DIP type power supply components on the front surface of the circuit board 3. Therefore, while manufacturing, both sides of the circuit board 3 have to be processed through SMT operation. Generally speaking, in terms of cost, while the circuit board with a relatively small area, it is not in big difference between double-layer circuit board which two surfaces be able for mounting SMT type elements and single-layer circuit board e.g. a PWB (Printed Wire Board) which only one surface be able for mounting SMT type elements. However, as luminance demand as well as the power demand increasing, the area of the circuit board is much larger increase for high-power power supply products, which the diameter may be from tens of centimeters to hundreds of centimeters, the cost of the double-layer circuit board is far higher than the cost of the single-layer circuit board.

In order to reduce cost, the single-layer circuit board can be used to manufacture the power supply board and the lamp panel separately, instead of using the expensive double-layer circuit board. However, since the power supply board and the lamp panel are formed from different single-layer circuit board, additional processes are needed for connecting and assembling them, which brings an additional cost. Moreover, since the power supply board and the lamp panel are manufactured separately, some spare area of the circuit board is not utilized causing a low utilization rate of the PWB. As a result, the non-integrated power supply board and the lamp panel design increases the manufacture cost in other aspects.

Therefore, it is urgent to develop an improved integration design of a lamp panel and a power supply board and a method of manufacture thereof, which can effectively save the cost in bill of material and assembly process.

SUMMARY

In order to provide an improved design of an illumination module to effectively save cost in material and assembly process, the invention provides a method of fabricating a light module, comprising the steps of: providing a closed curve on a prefabricated substrate; separating the prefabricated substrate into a first region outside the closed curve and a second region inside the closed curve; providing light emitting elements and a first electronic element on a first surface of the prefabricated substrate, wherein the light emitting elements are disposed on one of the first region and the second region, and the first electronic element is disposed on the other one of the first region and the second region; providing a second electronic element on a second surface of the prefabricated substrate opposite to the first surface, the second electronic element located on a region corresponding to the region on which the first electronic element is disposed; separating the first region and the second region of the prefabricated substrate along the closed curve to form a first substrate and a second substrate correspondingly; and assembling and fixing the second substrate to the first substrate at a separation opening.

The invention further provides a light module, comprising: a first substrate and a second substrate formed by separating from a prefabricated substrate along a closed curve, and the first substrate being assembled and fixed to the second substrate; light emitting elements provided on one of the first substrate and the second substrate; and a drive element provided on the other one of the first substrate and the second substrate, the drive element for driving the light emitting elements.

DETAILED DESCRIPTION OF THE INVENTION

Now various embodiments are referred in detail, and one or more examples of these embodiments are illustrated in the accompanying drawings. The embodiments of the invention are provided in a manner of explanation, but it is not limited thereto. For example, the feature explained or described as a part of one embodiment may be applied to, or combined with any other embodiments to produce another embodiment. The invention aims to include these modifications and variations.

Figure 2A:
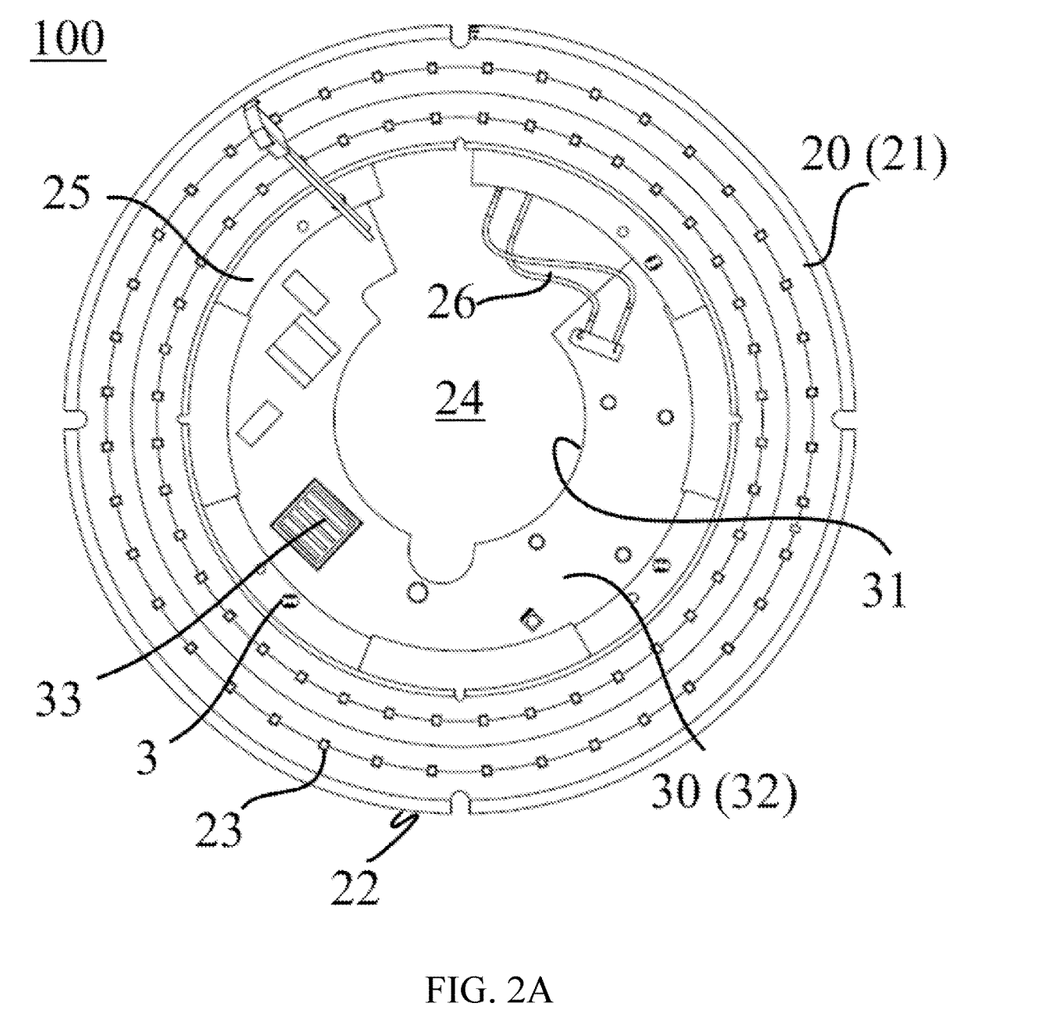
FIGS. 2A-2B illustrate schematic views of a light module according to one embodiment of the invention.
Figure 2B:
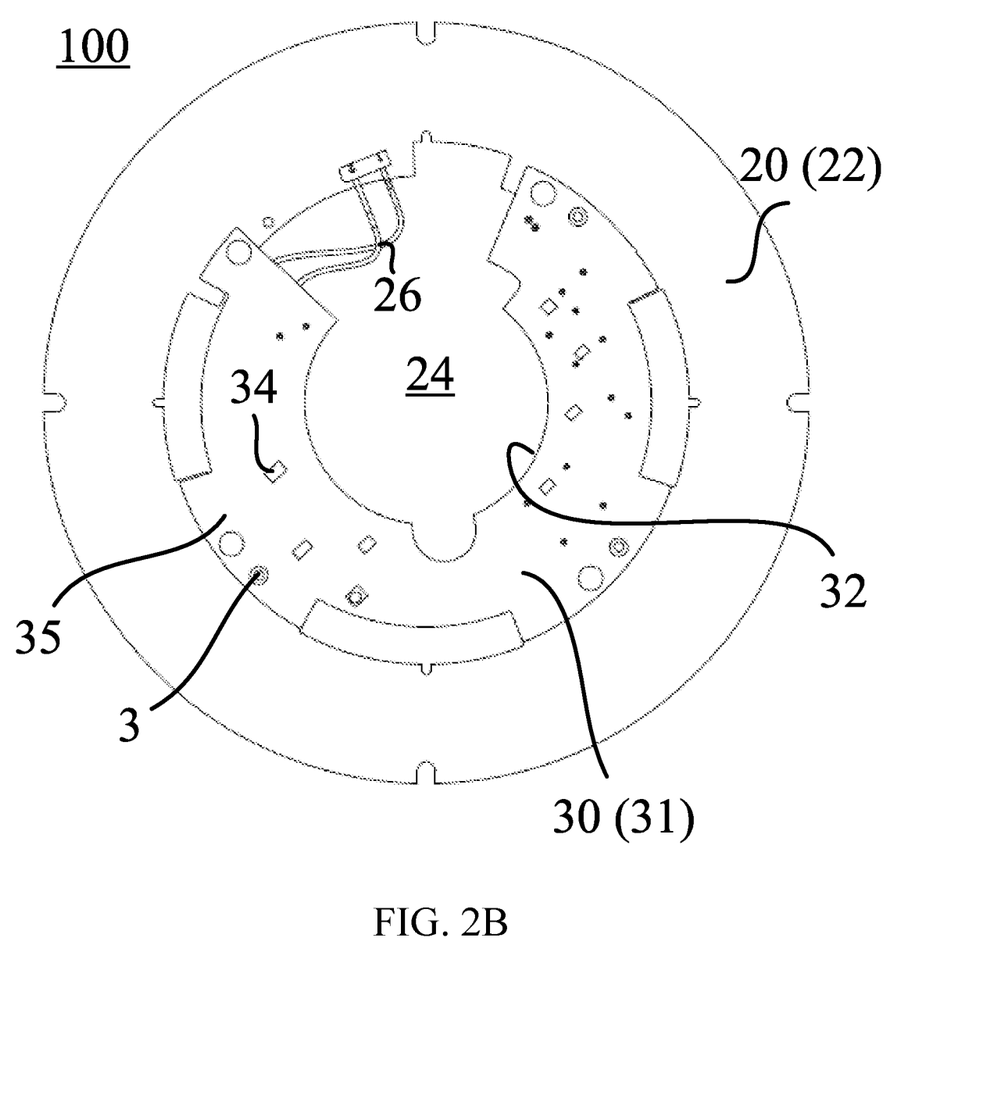

FIGS. 2A-2B illustrate schematic views of a light module 100 according to one embodiment of the invention. FIG. 2A illustrates a front view of the light source module 100, and FIG. 2B illustrates a back view of the light module 100.

The light module 100 includes a first substrate 20 and a second substrate 30, which serve as a light source board and a power supply board, respectively. In the embodiment illustrated by FIGS. 2A-2B, the first substrate 20 has a first surface 21 and a second surface 22 opposite to the first surface 21. Light emitting elements 23 are disposed on the first substrate 20, so that the first substrate 20 serves as the light source board (or light panel). The second substrate 30 has a third surface 31 and a fourth surface 32 opposite to the third surface 31. Drive elements 33, 34 for driving the light emitting elements 23 are disposed on the second substrate 30, so that the second substrate 30 serves as the power supply board (or driver board). As illustrated in FIGS. 2A-2B, the first substrate 20 acting as the light source board is on an outer area of the light module, and has an opening 24 at a substantial center position corresponding to the first substrate 20. The second substrate 30 acting as the power supply board, is on an inner area of the light module, and is detachable connected to the first substrate 20 at the opening 24 by using fastener 3, such as, screws, rivets and the like. In some other embodiments, the first substrate 20 and the second substrate 30 also can be connected by the way of adhesion, but the case is not limited thereto.

Although the first substrate 20 is used as the light source board and the second substrate 30 is used as the power supply board in the embodiment illustrated by FIGS. 2A-2B, but it is not limited thereto. In some embodiments, the light emitting elements also can be disposed on the second substrate 30 so that the second substrate 30 is able to serve as the light source board. Vice versa, the drive elements can be disposed on the first substrate 20 so that the first substrate 20 is able to serve as the power supply board as well.

Further, in some embodiments, the light emitting elements 23 are disposed on the first surface 21 of the light source board. The drive elements 33, 34 include first electronic element disposed on the third surface 31 of the power supply board, and second electronic element disposed on the fourth surface 32 of the power supply board. The first surface 21 of the light source board and the fourth surface 32 of the power supply board face the same direction. The light emitting elements and the first electronic element are SMT (Surface Mounted Technology) type elements, and the second electronic element is DIP (dual in-line package) type elements.

Figure 3A:
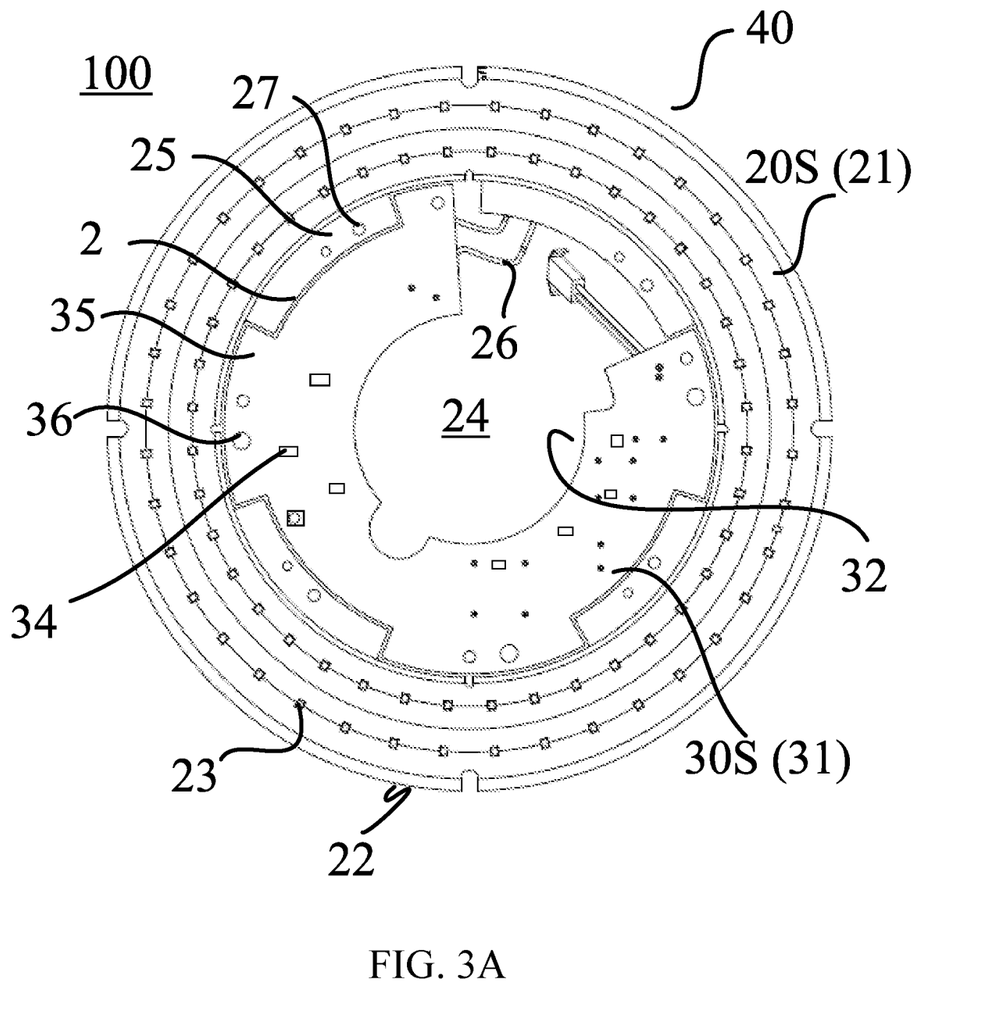
FIGS. 3A-3B illustrate schematic views of the light module before a process of separating substrates according to one embodiment of the invention.
Figure 3B:
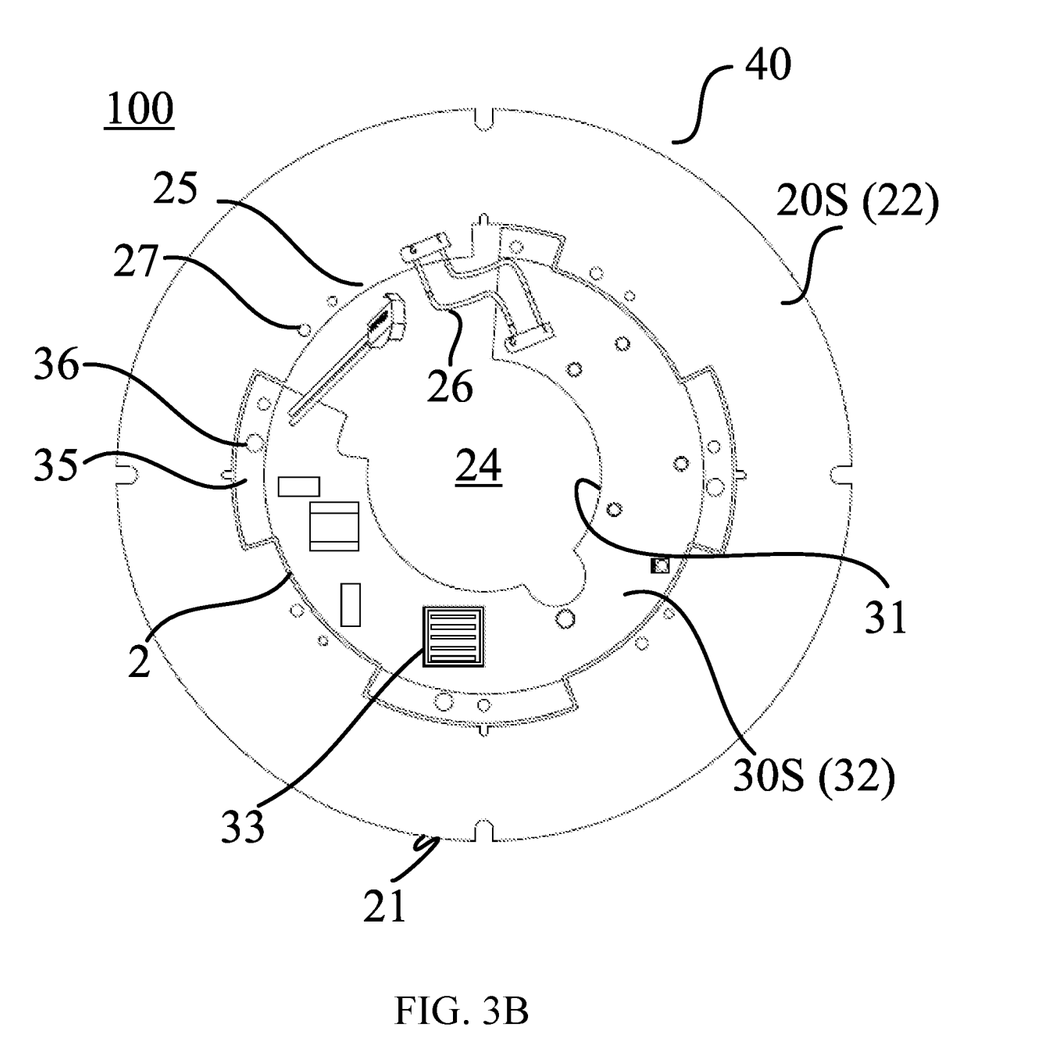

FIGS. 3A-3B illustrate schematic views of the light emitting module 100 of FIGS. 2A-2B during fabrication. As illustrated in FIGS. 3A-3B, during the manufacture of the light emitting module 100, firstly, a prefabricated substrate 40 is prepared, the prefabricated substrate 40 has a closed curve 2 thereon, such that the closed curve 2 divides the prefabricated substrate 40 into a first region 20S outside the closed curve 2 and a second region 30S inside the closed curve.

In the prefabricated substrate 40, the first surface 21 of the first region 20S shares the same plane with the third surface 31 of the second region 30S, and the second surface 22 of the first region 20S shares the same plane with the fourth surface 32 of the second region 30S. Therefore, when the prefabricated substrate 40 is separated along the curve 2, the first region 20S is separated from the prefabricated substrate 40 to form the first substrate 20 in FIGS. 2A and 2B, and the second region 30S is separated from the prefabricated substrate 40 to form the second substrate 30 in FIGS. 2A and 2B. After the first substrate 20 and the second substrate 30 are separated from the prefabricated substrate 40, an opening 24 is defined by the curve 2. Compared with the conventional solution of fabricating the power supply board and the light source board individually, the first substrate 20 and the second substrate 30 are directly formed on the single prefabricated substrate 40. Further, the original wasted PCB inner area is utilized to form the second substrate 30, so that increases the utilization rate of the substrate when the light module 100 is manufactured, and reduces the manufacture cost.

Since the first substrate 20 and the second substrate 30 are separated from the prefabricated substrate 40, it also can be considered that the prefabricated substrate itself is the first substrate, and the second substrate is separated from the first substrate along the closed curve.

Further, as illustrated in FIGS. 3A-3B, after the second substrate 30 and the first substrate 20 are separated from the prefabricated substrate 40, either the first substrate 20 or the second substrate 30 is flipped by 180 degrees, and then the second substrate 30 is detachable connected to and/or fixed with the first substrate 20, thereby the light module 100 illustrated in FIGS. 2A-2B is obtained. In terms of surfaces of the prefabricated substrate 40, the first surface 21 of the first substrate 20 originally shares the same plane with the third surface 31 of the second substrate 30 and the second surface 22 of the first substrate 20 shares the same plane with the fourth surface 32 of the second substrate 30. After flipping and assembling the flipped substrate, the light module 100 have the first surface 21 of the first substrate 20 and the fourth surface 32 of the second substrate 30 facing the same side, and the second surface 22 of the first substrate 20 and the third surface 31 of the second substrate 30 are facing the other side.

In practice, the light emitting elements need to provide lighting outwardly, so the location of the light emitting elements on the light module generally is placed to face objects to be emitted, for example, defined as a front surface. In some embodiments, shown in FIGS. 3A-3B, the light emitting elements 23 are disposed on the first surface 21 of the first substrate 20. When the light module 100 is mounted to a ceiling of a room, the first surface 21 of the first substrate 20 needs to face downwardly to allow the light emitting elements 23 thereon to supply illumination to objects, so the first surface 21 of the first substrate 20 is a front surface of the light module 100. Contrarily, the second surface 22 of the first substrate 20 is tightly close to the ceiling, so the second surface 22 of the first substrate 20 can be defined as a back surface of the light module 100. In some embodiments, the light emitting elements 23 are SMT type elements, such as, light emitting diodes (LED), and also can be electroluminescent diodes, laser diodes and the like, but the case is not limited thereto. Moreover, the drive elements may include DIP type drive element 33 and SMT type drive element 34. Wherein, the light emitting elements 23 and the SMT type drive element 34 are SMT type elements having smaller height, and hence do not need large mounting clearance. However, the DIP type drive element 33 often has a certain height, or a larger volume (such as inductance), so they need more space or clearance. Considering of the above reasons, it is better to dispose the light emitting elements 23 and the DIP type drive element 33 on the front surface of the light module, and to place the SMT type drive element 34 on the back surface of the light module. If the light module is formed by a single substrate, both front surface and back surface of the substrate need to be processed by SMT flow, which undoubtedly increases the fabricating cost.

In the embodiments of the invention, as shown in FIGS. 3A and 3B, when the light module 100 is fabricated, the light emitting elements 23 and the SMT type drive element 34 are disposed on the first surface 21 of the first region 20S and the third surface 31 of the second region 30S in the same SMT flow. Then the DIP type drive element 33 is assembled on the fourth surface 32 of the second region 30S. Since the first surface 21 of the first region 20S shares the same plane with the third surface 31 of the second region 30S, at this moment, the first region 20S (i.e., the first substrate 20) is not separated from the second region 30S (i.e., the second substrate 30), and the first substrate 20 and the second substrate 30 are in a state of the same prefabricated substrate 40. In such circumstance, only the first surface 21 of the first region 20S and the third surface 31 of the second region 30S (i.e., only one surface of the prefabricated substrate 40) need to be processed by SMT flow. That is it requires only a single-layer circuit board for accommodating all SMT type elements (including drive element and light emitting elements). As a result, the invention can use sing-layer circuit board to replace double-layer circuit board in conventional design, thereby heavily reducing the BOM cost and manufacturing cost thereof.

After the second substrate 30 and the first substrate 20 are separated from the prefabricated substrate 40 along the curve 2, the second substrate 30 is flipped by 180 degrees, the third surface 31 of the second substrate 30 originally sharing the same front plane with the first surface 21 of the first substrate 20 faces the back now, and the fourth surface 32 of the second substrate 30 originally sharing the same back plane with the second surface 22 of the first substrate 20 faces the front now, as shown in FIGS. 2A-2B. The SMT type drive element 34 mounted on the second substrate 30 face towards the back surface (for example, the ceiling) of the light module 100, and the DIP type drive element 33 mounted on the second substrate 30 face towards the front surface of the light module 100, such that the back surface of the light module 100 can be tightly close to the ceiling, and the clearance between the light module 100 and the ceiling is minimized. Therefore, the light module provided by the invention is fabricated using a single-layer circuit board with a single surface suitable for mounting SMT type elements, which reduces the manufacture cost. Meanwhile, the present invention separates the second substrate from the first substrate, rather than forming the first substrate and the second substrate individually, which increases utilization rate of the substrate, thereby further reducing the BOM cost. Finally, the second substrate is attached to the first substrate after being flipped by 180 degrees, so as to not only ensure that a clearance between the back surface of the light module and the ceiling is minimized, but also further reduces the manufacture cost.

In some embodiments, the curve 2 is a fluctuation line, such as, a square wave line shown in FIGS. 3A-3B. In some other embodiments, the curve 2 also could be a wavy line, a sawtooth line or a line in similar shape. The shape of the curve 2 causes the first region 20S to form a first uneven part 25 surrounding the opening 24, and the second region 30S to form a second uneven part 35 on the periphery thereof. The shape of the first uneven part 25 can be complementary to the shape of the second uneven part 35. After the second substrate 30 and the first substrate 20 are separated from the prefabricated substrate 40 along the curve 2, the second substrate 30 is flipped, and the first substrate 20 and the second substrate 30 are rotated by a certain angle relative to each other, such that the first uneven part 25 and the second uneven part 35 can at least partially overlap with each other, as shown in FIGS. 2A-2B, and the second substrate 30 is connected with the first substrate 20 at the overlapped region of the uneven parts.

In some embodiments, holes 27 and 36 are set on the first uneven part 25 and the second uneven part 35 respectively. As illustrated in FIGS. 2A-2B, after the first substrate 20 and the second substrate 30 are rotated relative to each other, the hole 27 is aligned with the corresponding hole 36, and the first substrate 20 and the second substrate 30 are detachable connected with each other using fastener 3, such as screws, rivets and the like. By using the fastener 3 to assemble the first substrate 20 and the second substrate 30, so when one of the light emitting elements 23 and the drive elements 33, 34 has failure, the fastener 3 can be removed to separate the first substrate 20 and the second substrate 30, such that only the substrate in fault need to be exchanged, without exchanging the entire light module. In some embodiments, the second substrate 30 also can be attached to the first substrate 20 using adhesive at the overlapped region of the uneven parts.

As shown in FIGS. 3A-3B, the light module further includes wires 26 electrically connecting the light emitting elements 23 on the first region 20S with the drive elements 33, 34 on the second region 30S. The drive elements 33, 34 send power and control signals to the light emitting elements 23 via the wires 26 to control and adjust the brightness of the light emitting elements 23. Since wires 26 are flexible, even if the second substrate 30 is flipped as illustrated in FIGS. 2A-2B, the wires 26 can be twisted along with flipping of the second substrate 30, which ensures the electrical connection between the light emitting elements 23 and the drive elements 33, 34.

Figure 4:
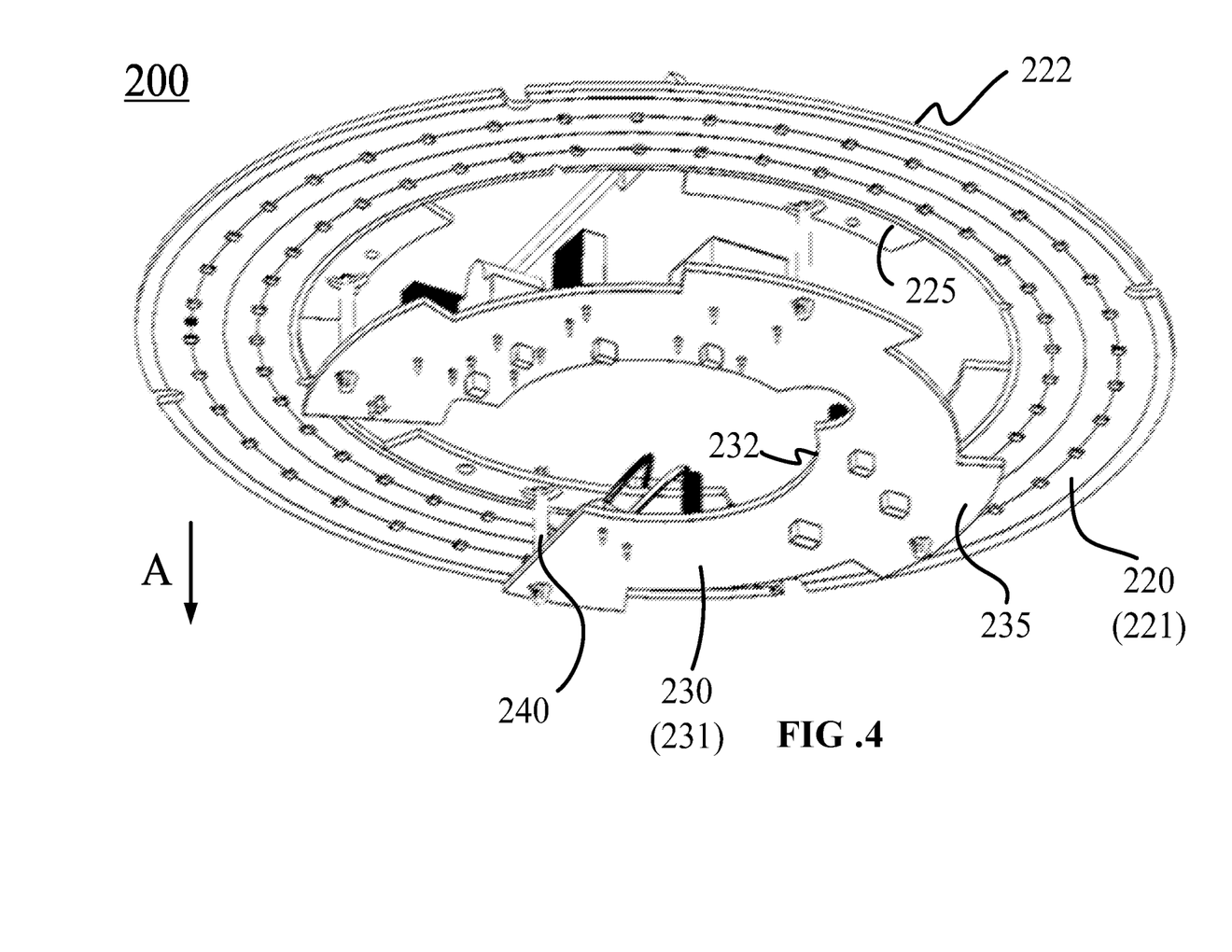
FIG. 4 illustrates a perspective diagram of a light module according to another embodiment of the invention.

Referring to FIG. 4, which illustrates a perspective diagram of a light emitting module 200 according to another embodiment of the invention.

Similar to the light module 100 shown in FIGS. 2A-2B, the first substrate 220 and the second substrate 230 of the light module 200 are also formed by separating from a prefabricated substrate. The difference with the light module 100 is that after the first substrate 220 and the second substrate 230 are separated from the prefabricated substrate, the second substrate 230 is moved in a direction A perpendicular to a first surface 221 of the first substrate 220, such that the first substrate 220 and the second substrate 230 are converted from a state where the first substrate 220 and the second substrate 230 share the same plane before movement into a state where the first substrate 220 and the second substrate 230 are respectively located on different planes. That is, after movement, the first substrate 220 is disposed on a first plane, and the second substrate 230 is disposed on a second plane, wherein the first plane and the second plane are parallel to each other, but apart from each other with a gap along direction A. For example, when the light emitting elements are mounted on the first surface 221 of the first substrate 220, the second substrate 230 is apart from the first substrate 220 along an illumination direction of the light emitting elements (i.e., the direction from the ceiling towards the ground), such that the first substrate 220 and the second substrate 230 have a certain difference in height. In some embodiments, the height difference could be the height of the tallest DIP type element. In some other embodiments, for example, the height difference also could be a half height of the tallest DIP type element, and so on, but the case is not limited thereto. Since a third surface 231 of the second substrate 230 is mounted with SMT type element, and a fourth surface 232 of the second substrate 230 is mounted with DIP type element, the DIP type element occupies a larger space as compared to the SMT type element. Therefore, the second substrate 230 and the first substrate 220 are assembled at different height to provide an accommodation space for the DIP type element. The accommodation space is defined by the ceiling or the housing of the light module 200 and the second substrate 230, and is suitable for accommodating the DIP type element mounted on the fourth surface 232 of the second substrate 230.

Therefore, the manner of placing the second substrate 230 apart from the first substrate 220 of the light module 200 could be used as an alternative for the manner of flipping the second substrate relative to the first substrate of the light module 100 illustrated in FIGS. 2A-3B. Both can be manufactured just using a single-layer circuit board with a single surface suitable for mounting SMT type elements for providing an additional space for accommodating the DIP type element, so as to reduce the manufacture cost. Meanwhile, the first substrate and the second substrate are formed and separated from the same prefabricated substrate of single-layer circuit board, instead of the manner of forming the first substrate and the second substrate individually from different prefabricated substrate, such that increases utilization rate of the substrate, thereby further reducing the BOM cost. Further, the second substrate is set apart relative to the first substrate to form the space to accommodate the DIP type element, so as to ensure that a mounting space between the back surface of the light module and the ceiling is minimized while reducing the manufacture cost.

Similar to the light module 100 illustrated in FIGS. 2A-3B, the first substrate 220 and the second substrate 230 are formed by separating from a prefabricated substrate along a closed curve, and the first substrate 220 and the second substrate 230 also have a first uneven part 225 and a second uneven part 235 that are complementary to each other. After the second substrate 230 is apart from the first substrate 220, the second substrate 230 is further rotated relative to the first substrate 220, such that at least a portion of a projection of the first uneven part 225 on the ceiling or ground overlaps a projection of the second uneven part 235 on the ceiling or ground. Therefore, after rotation, the first substrate 220 is detachable connected to the second substrate 230 at the overlapped portion of the first uneven part 225 and the second uneven part 235 using fastener 240 (such as, screws, rivets and the like).

Figure 5:
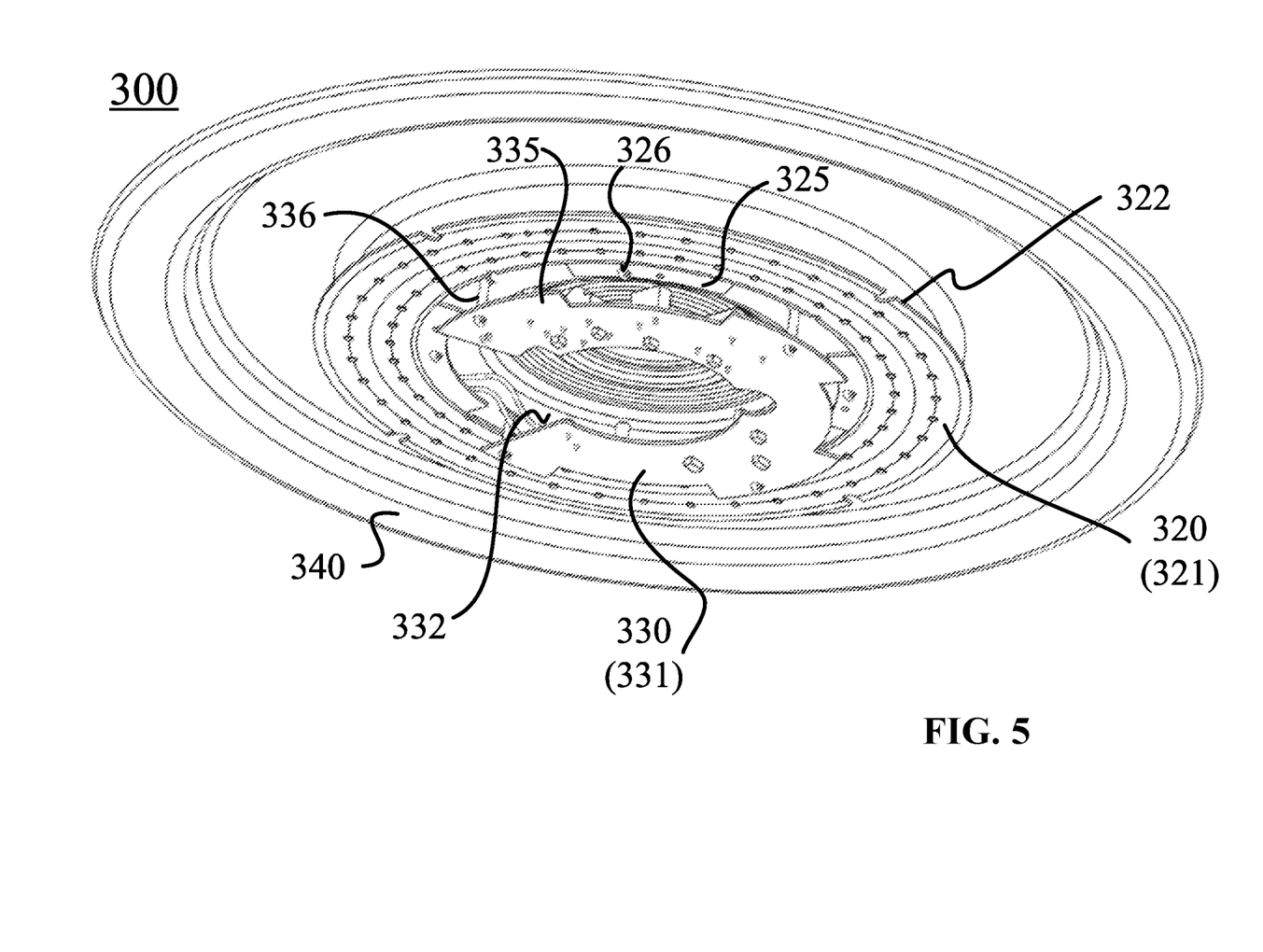
FIG. 5 illustrates a perspective diagram of a light module according to the other embodiment of the invention.

Referring to FIG. 5, which is a perspective diagram of a light module 300 according to the other embodiment of the invention. The light module 300 is substantially the same as the light module 200 shown in FIG. 4. Difference is that after a first substrate 320 and a second substrate 330 are separated from a prefabricated substrate, and the second substrate 330 is set apart relative to the first substrate 320, it could be unnecessary to rotate the second substrate 330 relative to the first substrate 320. Alternatively, the first substrate 320 and the second substrate 330 could be connected respectively to a housing 340 (FIG. 5 illustrates a portion of the housing 340) by using fastener 326, 336; and the housing 340 is mounted to the ceiling and configured to accommodate the first substrate 320 and the second substrate 330. Therefore, even if the first substrate 320 and the second substrate 330 are not rotated, effects of reducing the manufacture cost, increasing utilization rate of the substrate, and ensuring that a mounting space between the back surface of the light module and the ceiling is minimized can be achieved, just like the light module 100 shown in FIGS. 2A-3B and the light module 200 shown in FIG. 4.

Figure 6:
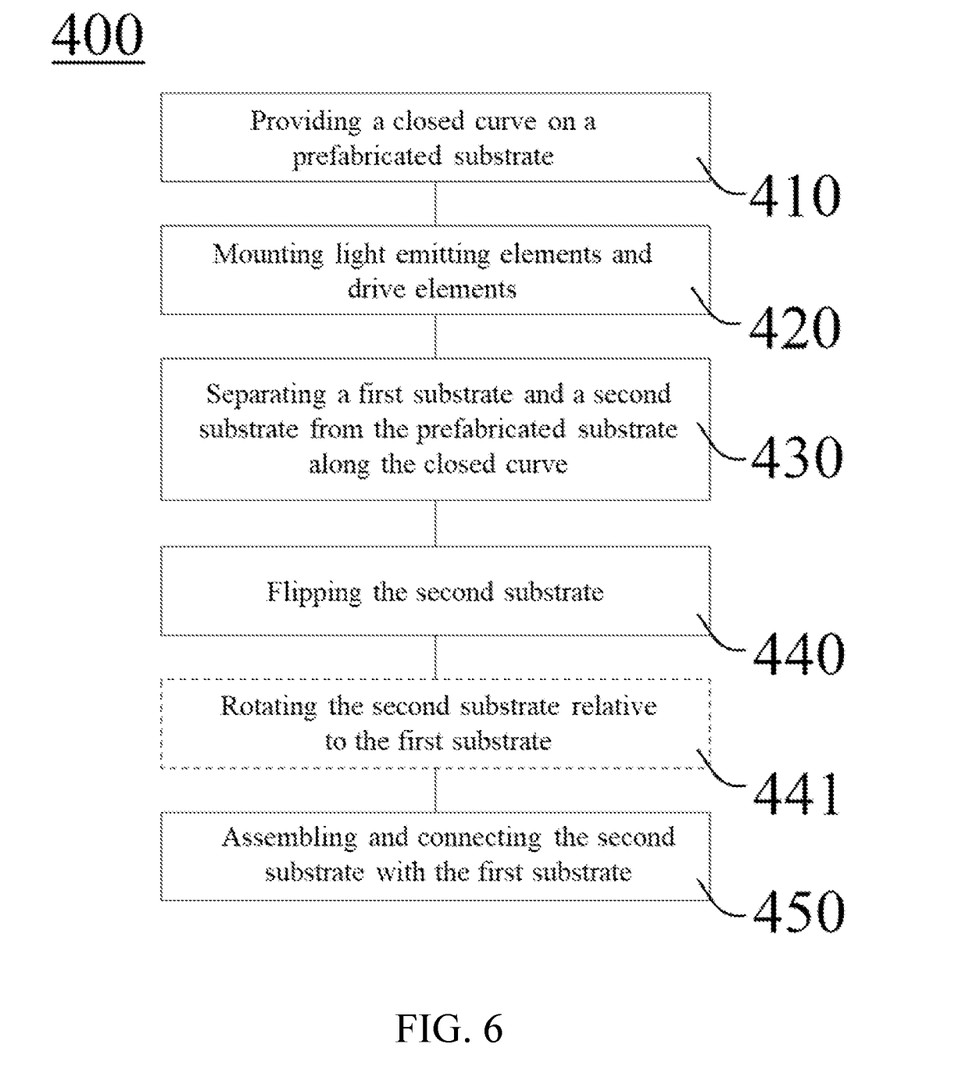
FIG. 6 illustrates a flow chart of a method of manufacturing a light module according to the embodiment of the invention.

FIG. 6 is a flow chart of a method 400 of manufacturing a light module according to the embodiment of the invention. Hereinafter the method of manufacturing a light module is described with reference to FIGS. 2A-2B and 3A-3B.

In step 410, a closed curve 2 is determined on a prefabricated substrate 40, such that the prefabricated substrate 40 is separated into a first region 20S outside the curve 2 and a second region 30S inside the curve 2. In some embodiments, the curve 2 is a fluctuation line, such as, a square wave line illustrated in FIGS. 3A-3B. In some other embodiments, the curve 2 also could be a wavy line, a sawtooth line or a line in similar shape.

In step 420, light emitting elements 23 and drive elements 33, 34 are mounted on the prefabricated substrate 40. The light emitting elements 23 are SMT type elements, and the drive elements comprise DIP type drive element 33 and SMT type drive element 34. In some embodiments, the light emitting elements 23 and the SMT type drive element 34 are disposed on a first surface of the prefabricated substrate 40, as shown in FIGS. 3A-3B. The light emitting elements 23 are mounted in the first region 20S of the first surface, and the SMT type drive element 34 is mounted in the second region 30S of the first surface and on the same side of the light emitting elements 23, and the DIP type drive element 33 is disposed in the second region 30S and on the other side opposite to the SMT type drive element 34, i.e., a second surface. After the light emitting elements 23 and the SMT type drive elements 34 are mounted through SMT flow process, the DIP type drive element 33 are inserted into the prefabricated substrate 40, and then the prefabricated substrate 40 are processed by a reflow oven to be tinned, such that the light emitting elements 23 and the drive elements 33, 34 are mounted on the prefabricated substrate 40. In some other embodiments, the light emitting elements 23 can be mounted in the second region 30S, while the drive elements 33, 34 can be mounted in the first region 20S.

In step 430, the first region 20S and the second region 30S are separated along the closed curve 2, such that the first region 20S serves as a first substrate 20 after separation, and the second region 30S serves as a second substrate 30 after separation. Moreover, an opening 24 defined by the closed curve 2 is formed on the first substrate 20.

In step 440, the second substrate 30 is flipped by 180°, such that a surface mounted with the light emitting elements 23 and a surface mounted with the DIP type drive element 33 face the same side, and the surface mounted with the light emitting elements 23 and a surface mounted with the SMT type drive element 34 face opposite sides. In some other embodiments, the first substrate 20 can be flipped by 180 degrees.

In step 450, the second substrate 30 is assembled with the first substrate 20 at the opening 24 after being flipped.

In some embodiments, a line shape of the closed curve 2 allows the first substrate 20 to form a first uneven part 25 surrounding the opening 24, and the second substrate 30 to form a second uneven part 35 on the periphery of the second substrate 30, and the shape of the first uneven part 25 is complementary to the shape of the second uneven part 35. The step 440 and the step 450 could further include a step 441 there between. In step 441, the second substrate 30 after being flipped is rotated by a certain angle relative to the first substrate 20, such that the second uneven part 35 at least partially overlaps the first uneven part 25, and the first substrate 20 is attached to the second substrate 30 at the overlapped region of the uneven parts.

Figure 7:
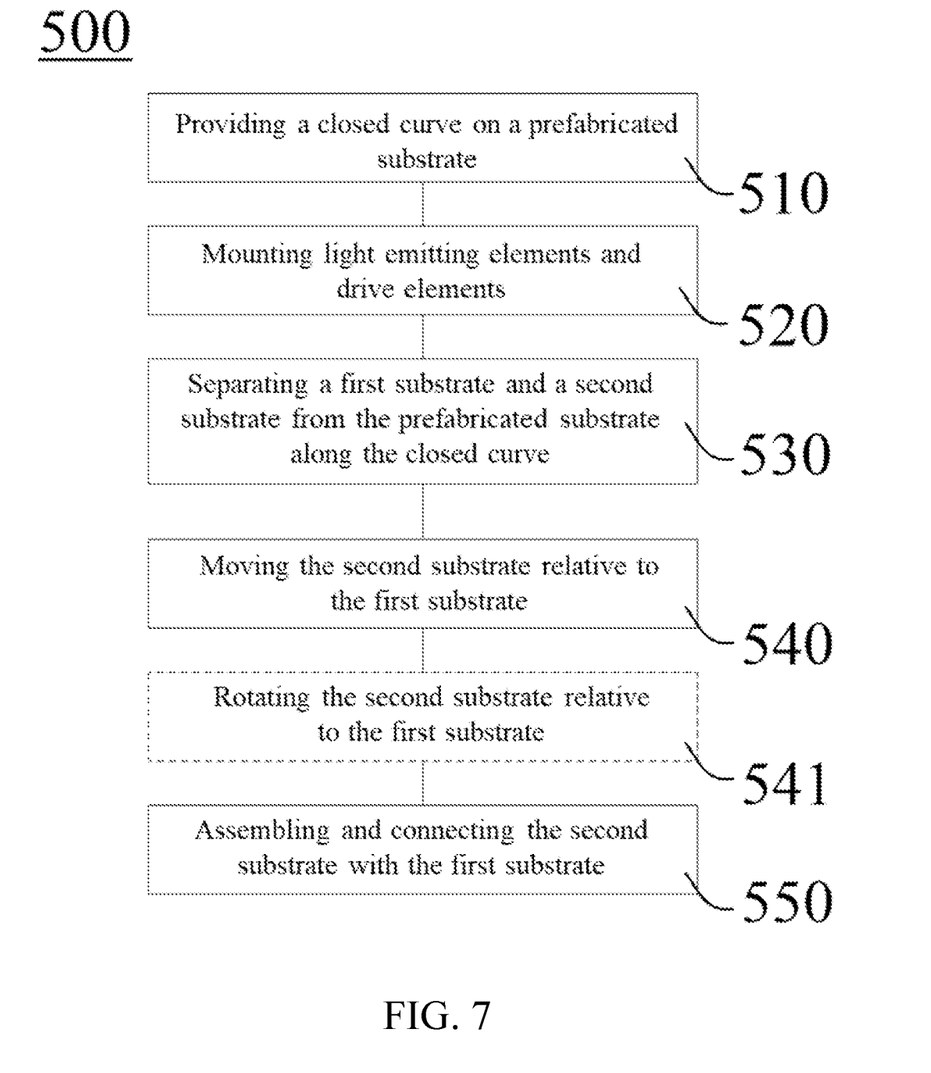
FIG. 7 illustrates a flow chart of a method of manufacturing a light module according to another embodiment of the invention.

Referring to FIG. 7, which is a flow chart of a method 500 of manufacturing a light module according to another embodiment of the invention. The method 500 is described with reference to FIGS. 4 and 5.

Steps 510-530 are the same as steps 410-430 of the method 400 illustrated in FIG. 6, so details are not repeated here.

In step 540, as illustrated in FIG. 4, after the first substrate 220 and the second substrate 230 are separated from the prefabricated substrate, the second substrate 230 is moved in a direction A perpendicular to the first surface 221 of the first substrate 220, such that the moved first substrate 220 is located on the first plane, and the second substrate 230 is located on the second plane, wherein the first plane and the second plane are parallel to each other, but apart from each other with a gap along direction A. Hence, the moved first substrate 220 and the second substrate 230 have a certain difference in height, which provides a space for accommodating DIP type element mounted on the second surface 232 of the second substrate 230.

In step 550, after the second substrate is apart from the first substrate, the first substrate and the second substrate are detachable connected to and/or fixed with each other. For example, as illustrated in FIG. 5, the first substrate 320 and the second substrate 330 can be connected respectively to the housing 340 using fastener, and the housing 340 is mounted to the ceiling and configured to accommodate the first substrate 320 and the second substrate 330.

In addition, the method may further have step 541. As described in FIG. 4 and the above context, the first substrate 220 and the second substrate 230 are separated from the prefabricated substrate along a closed curve, and the first substrate 220 and the second substrate 230 also have the first uneven part 225 and the second uneven part 235 that are complementary to each other. In step 541, the second substrate 230 is further rotated relative to the first substrate 220, such that a projection of the first uneven part 225 on the ceiling or ground overlaps at least a portion of a projection of the second uneven part 235 on the ceiling or ground. Step 550 in such case, the first substrate 220 is detachable connected with the second substrate 230 at the overlapped portion of the first uneven part 225 and the second uneven part 235 using fastener.

Although the above-mentioned contents involve embodiments of the invention, other and further embodiments of the invention can be designed without departing from the basic extent of protection of the invention, and the extent of protection of the invention is determined by the appended claims.

What is claimed is:

1. A light module, comprising:
a first substrate and a second substrate formed by separating from a prefabricated substrate along a closed curve, and the first substrate being assembled and connected with the second substrate;
light emitting elements disposed on one of the first substrate and the second substrate; and
a drive element disposed on the other one of the first substrate and the second substrate, the drive element configured to drive the light emitting elements.

2. The light module according to claim 1, wherein the second substrate is assembled and connected with the first substrate after being flipped by 180 degrees.

3. The light module according to claim 1, wherein the second substrate is apart from the first substrate in a direction perpendicular to a surface of the first substrate, such that the first substrate is located on a first plane, and the second substrate is assembled and connected with the first substrate after being located on a second plane, the first plane and the second plane being located on different planes.

4. The light module according to claim 1, wherein:
the first substrate is provided with a first uneven part along the closed curve, the second substrate is provided with a second uneven part along the closed curve, the first uneven part at least partially overlaps the second uneven part to form an overlapped region, and the first substrate is detachable connected to and/or fixed with the second substrate in the overlapped region.

5. The light module according to claim 4, wherein holes are set respectively on the first uneven part and the second uneven part of the overlapped region, and the first substrate and the second substrate are connected to each other via the holes and fastener.

6. The light module according to claim 1, wherein the first substrate and the second substrate are connected to a housing via fastener, wherein the housing is configured to accommodate the light module.

7. The light module according to claim 2, wherein one of the first substrate and the second substrate is a light source board, and the other is a power supply board, wherein:
the light emitting elements are disposed on a first surface of the light source board;
the drive element comprises first electronic element disposed on a third surface of the power supply board, and second electronic element disposed on a fourth surface of the power supply board,
wherein the third surface and the fourth surface of the power supply board are opposite to each other, and the first surface of the light source board and the fourth surface of the power supply board face the same direction.

8. The light module according to claim 7, wherein the light emitting elements and the first electronic element are SMT type elements, and the second electronic element is DIP type element.

9. The light module according to claim 3, wherein one of the first substrate and the second substrate is a light source board, and the other is a power supply board, wherein the power supply board is below the light source board, and,
   the light emitting elements are disposed on a first surface of the light source board;
   the drive element comprises first electronic element disposed on a third surface of the power supply board, and second electronic element disposed on a fourth surface of the power supply board,
   wherein the third surface and the fourth surface of the power supply board are opposite to each other, and the first surface of the light source board and the third surface of the power supply board face the same direction.

10. The light module according to claim 9, wherein the height difference between the power supply board and the light source board is a height of the tallest second electronic element.

11. The light module according to claim 9, wherein the light emitting elements and the first electronic element are SMT type elements, and the second electronic element is DIP type element.

* * * * *